United States Patent
Goto et al.

(10) Patent No.: US 8,482,184 B2
(45) Date of Patent: Jul. 9, 2013

(54) PLATE WAVE ELEMENT AND ELECTRONIC EQUIPMENT USING SAME

(75) Inventors: Rei Goto, Osaka (JP); Hidekazu Nakanishi, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 298 days.

(21) Appl. No.: 12/999,369

(22) PCT Filed: Jul. 8, 2009

(86) PCT No.: PCT/JP2009/003178
§ 371 (c)(1),
(2), (4) Date: Dec. 16, 2010

(87) PCT Pub. No.: WO2010/004741
PCT Pub. Date: Jan. 14, 2010

(65) Prior Publication Data
US 2011/0109196 A1  May 12, 2011

(30) Foreign Application Priority Data

Jul. 11, 2008  (JP) ................................. 2008-180949
Aug. 4, 2008  (JP) ................................. 2008-200776

(51) Int. Cl.
*H03H 9/25* (2006.01)
*H03H 9/02* (2006.01)

(52) U.S. Cl.
CPC ................................ *H03H 9/02559* (2013.01)
USPC ..................................................... 310/313 R

(58) Field of Classification Search
CPC ............ H03H 9/02559; H03H 9/02574; H03H 9/02834
USPC .................. 310/313 R, 313 A, 313 B, 313 C, 310/313 D See application file for complete search history.

(56) References Cited

U.S. PATENT DOCUMENTS

| | | | |
|---|---|---|---|
| 7,322,093 B2 * | 1/2008 | Kadota et al. | 29/594 |
| 2002/0158549 A1 * | 10/2002 | Itakura et al. | 310/313 R |
| 2006/0138902 A1 | 6/2006 | Kando | |
| 2006/0255884 A1 | 11/2006 | Tanaka | |
| 2007/0188047 A1 * | 8/2007 | Tanaka | 310/313 D |
| 2007/0267942 A1 | 11/2007 | Matsumoto et al. | |
| 2008/0179989 A1 | 7/2008 | Ogami et al. | |
| 2009/0115287 A1 | 5/2009 | Kando | |

FOREIGN PATENT DOCUMENTS

| | | |
|---|---|---|
| JP | 2002-152007 A | 5/2002 |
| JP | 2007-202087 A | 8/2007 |
| JP | 2007-312164 A | 11/2007 |
| JP | 2008-098974 A | 4/2008 |
| WO | WO2005/069486 A1 | 7/2005 |
| WO | WO2006/114930 A1 | 11/2006 |
| WO | WO2007/046236 A1 | 4/2007 |
| WO | WO2008/078481 A1 | 7/2008 |
| WO | PCT/JP2009/003178 | 10/2009 |

* cited by examiner

*Primary Examiner* — Derek Rosenau
(74) *Attorney, Agent, or Firm* — RatnerPrestia

(57) ABSTRACT

A plate wave element includes a piezoelectric body, a comb-shaped electrode disposed on an upper surface of the piezoelectric body, and a medium layer disposed on the upper surface of the piezoelectric body so as to cover the comb-shaped electrode. The comb-shaped electrode excites a Lamb wave as a main wave. The medium layer has a frequency temperature characteristic opposite to that of the piezoelectric body. The plate wave element has a preferable frequency temperature characteristic.

26 Claims, 12 Drawing Sheets

PLATE WAVE ELEMENT AND ELECTRONIC EQUIPMENT USING SAME

THIS APPLICATION IS A U.S. NATIONAL PHASE APPLICATION OF PCT INTERNATIONAL APPLICATION No. JP2009/003178

TECHNICAL FIELD

The present invention relates to a plate wave element through which plate waves propagates, and an electronic device using the plate wave element.

BACKGROUND ART

FIG. 17 is a schematic sectional view of conventional plate wave element 101 disclosed in Patent Literature 1. Plate wave element 101 has base substrate 102 and piezoelectric body 103 that is formed on base substrate 102. Piezoelectric body 103 is formed on upper surface 102A of base substrate 102, and a part of piezoelectric body 103 is removed from upper surface 102A of base substrate 102. In the removed part, lower surface 103A of piezoelectric body 103 faces upper surface 102A of base substrate 102 across space 111 between lower surface 103A and upper surface 102A. Comb-shaped electrode 104 is formed on upper surface 103B of piezoelectric body 103 opposite to lower surface 103A. Comb-shaped electrode 104 excites a plate wave, and plate wave element 101 can form a resonator and a filter.

Conventional plate wave element 101 can excite a wave of high speed without considering a loss due to bulk radiation. However, conventional plate wave element 101 does not have a preferable frequency temperature characteristic. When the plate wave is excited by comb-shaped electrode 104 in plate wave element 101, the thickness of piezoelectric body 103 is required to be extremely small. The small thickness reduces the strength of the element, accordingly producing a crack due to a stress applied to piezoelectric body 103.

Citation List

Patent Literature

Patent Literature 1: WO2007/046236

SUMMARY OF THE INVENTION

A plate wave element includes a piezoelectric body, a comb-shaped electrode disposed on an upper surface of the piezoelectric body, and a medium layer disposed on the upper surface of the piezoelectric body so as to cover the comb-shaped electrode. The comb-shaped electrode excites a Lamb wave as a main wave. The medium layer has a frequency temperature characteristic opposite to that of the piezoelectric body.

The plate wave element has a preferable frequency temperature characteristic.

DETAILED DESCRIPTION OF PREFERRED EMBODIMENTS

Exemplary Embodiment 1

Figure 1:
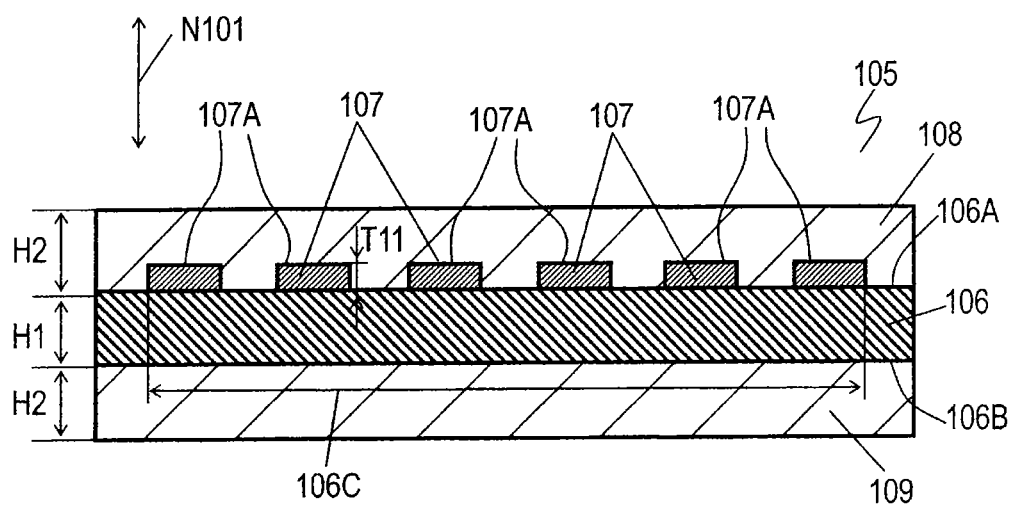
FIG. 1 is a schematic sectional view of a plate wave element in accordance with Exemplary Embodiment 1 of the present invention.

FIG. 1 is a schematic sectional view of plate wave element 105 in accordance with a first exemplary embodiment of the present invention. Plate wave element 105 includes piezoelectric body 106, comb-shaped electrode 107 disposed on upper surface 106A of piezoelectric body 106, medium layer 108 disposed on upper surface 106A of piezoelectric body 106 and upper surface 107A of comb-shaped electrode 107 so as to cover comb-shaped electrode 107, and medium layer 109 disposed on lower surface 106B of piezoelectric body 106. Comb-shaped electrode 107 is disposed in exciting region 106C of upper surface 106A of piezoelectric body 106. Medium layer 109 is positioned directly below exciting region 106C. Comb-shaped electrode 107 excites exciting region 106C of piezoelectric body 106 to make piezoelectric body 106 generate and propagate a plate wave. A main component of the propagated plate wave is a Lamb wave in plate wave element 105. Piezoelectric body 106, comb-shaped electrode 107, and medium layers 108 and 109 are stacked in normal direction N101 perpendicular to upper surface 106A and lower surface 106B of piezoelectric body 106. Piezoelectric body 106 has thickness H1 in normal direction N101, and medium layers 108 and 109 have thickness H2 in normal direction N101. Medium layer 109 faces comb-shaped electrode 107 across piezoelectric body 106.

Piezoelectric body 106 is formed of a lithium niobate single-crystal substrate of Z-cut X-propagation. However, piezoelectric body 106 may be formed of a lithium tantalate single-crystal substrate or a potassium niobate single-crystal substrate. Piezoelectric body 106 may be formed of a piezoelectric thin film instead of the single-crystal substrate.

Comb-shaped electrode 107 is made of aluminum according to Embodiment 1; however, comb-shaped electrode 107 may be made of an alloy mainly containing aluminum, single metal of copper, silver, or gold, or an alloy mainly containing them.

According to Embodiment 1, medium layers 108 and 109 are made of silicon oxide ($SiO_2$). However, they may be made of a medium having a frequency temperature coefficient (TCF) opposite to that of piezoelectric body 106. Medium layers 108 and 109 made of silicon oxide having a frequency temperature coefficient opposite to that of piezoelectric body 106 decreases the frequency temperature coefficient of plate wave element 105, accordingly improving the frequency temperature characteristic. The component of the propagating direction of a displacement of A1 mode as a Lamb wave has a node of an amplitude at the center of piezoelectric body 106 and has an antinode of the amplitude on a surface of piezoelectric body 106. Since piezoelectric body 106 is sandwiched between medium layers 108 and 109 across upper surface 106A and lower surface 106B, much of energy can be concentrated in piezoelectric body 106 and medium layer 108, thus improving the frequency temperature characteristic effectively.

Medium layer 108 that is disposed on upper surface 107A of comb-shaped electrode 107 so as to cover comb-shaped electrode 107 protects piezoelectric body 106 and comb-shaped electrode 107. Therefore, the electrode can be drawn out to an outer surface of medium layer 108 or 109 without air-tightly sealing plate wave element 105, hence allowing plate wave element 105 to be mounted to, e.g. a circuit board.

Plate wave element 105 of Embodiment 1 further includes a support substrate disposed on a lower surface of medium layer 109. This support substrate can increase the strength of the plate wave element. The support substrate may be made of silicon to be easily joined to medium layer 109.

In plate wave element 105 of Embodiment 1 shown in FIG. 1, the relationship between ratio $H1/\lambda$ and frequency temperature coefficient TCF was confirmed when lithium niobate is used for piezoelectric body 106. Here, H1 is a thickness of piezoelectric body 106, and $\lambda$ is a wavelength of a plate wave as an elastic wave excited by comb-shaped electrode 107. At this moment, a method by Campbell et al. was used, and a constant by Smith et al. was used as a material constant of lithium niobate.

A plate wave is one of bulk waves, and is an elastic wave that propagates while repetitively displacing a substrate at upper and lower surfaces of the substrate. A plate wave includes a Lamb wave having high speed dispersibility or an SH wave mainly including a transverse wave component. The Lamb wave is a plate wave generated by an SV wave and a longitudinal wave (compressional wave) that cause mode change on upper and lower surfaces of the plate and that are complicatedly coupled with each other. The SH wave is in mode mainly including a transverse wave.

Modes of the plate wave excited in piezoelectric body 106 by comb-shaped electrode 107 typically includes an A0 mode called a bending wave, an SH0 mode mainly including a transverse wave, an S0 mode mainly including a longitudinal wave, and an A1 mode called a Lamb wave as high-order mode mainly including a longitudinal wave.

The SH0 mode has large coupling coefficient k2 but has a low sound speed, and can hardly provide a plate wave element applicable to a high-frequency device. The S0 mode and the A0 mode have small coupling coefficient k2, and can hardly provide a plate wave element applicable to a wide-band device. Therefore, the A1 mode is advantageous for high frequencies and wide bands. In a Lamb wave element which is a plate wave element through which the Lamb wave of A1 mode propagates, a resonance frequency is determined based on the thickness of piezoelectric body 106 and a pitch of electrode fingers of comb-shaped electrode 107. Such a high-sound-speed mode can easily provide a plate wave element applicable to higher frequencies. This can increase thickness H1 of piezoelectric body 106, accordingly allowing the plate wave element to be easily manufactured and improving its yield rate. Especially, the thickness H1 of the piezoelectric body not smaller than $0.4\lambda$ suppresses spurious caused by a resonance of the S0 mode. Therefore, the Lamb wave element used as a filter or a duplexer prevents the frequency characteristic due to an influence of the spurious from deteriorating.

Figure 2:
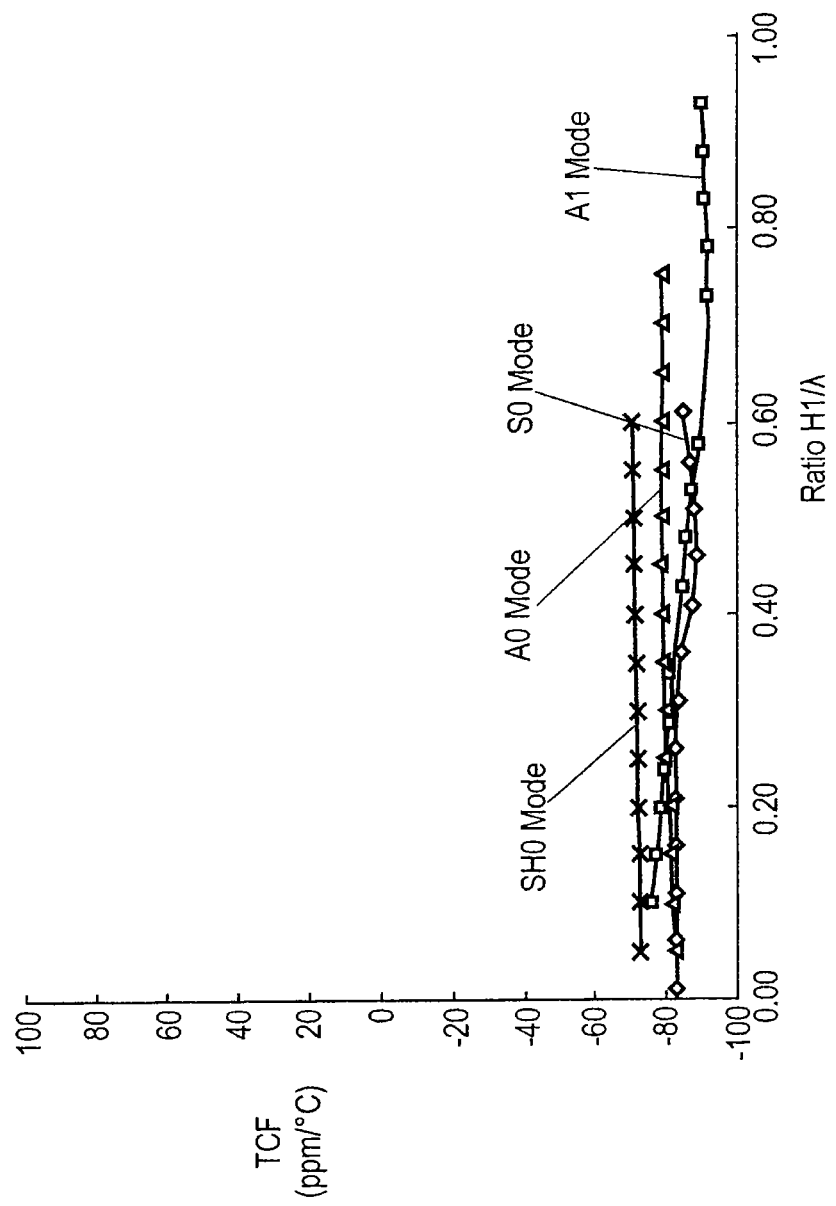
FIG. 2 shows a frequency temperature characteristic of a plate wave element of a comparative example.

FIG. 2 shows the relationship between frequency temperature coefficient TCF and ratio $H1/\lambda$ in each mode of a plate wave element of a comparative example that does not have medium layers 108 and 109. As shown in FIG. 2, frequency temperature coefficient TCF of the A1 mode is insufficient, −76 to −92 ppm/°C. at $0.1 < H1/\lambda < 1.0$.

Figure 3:
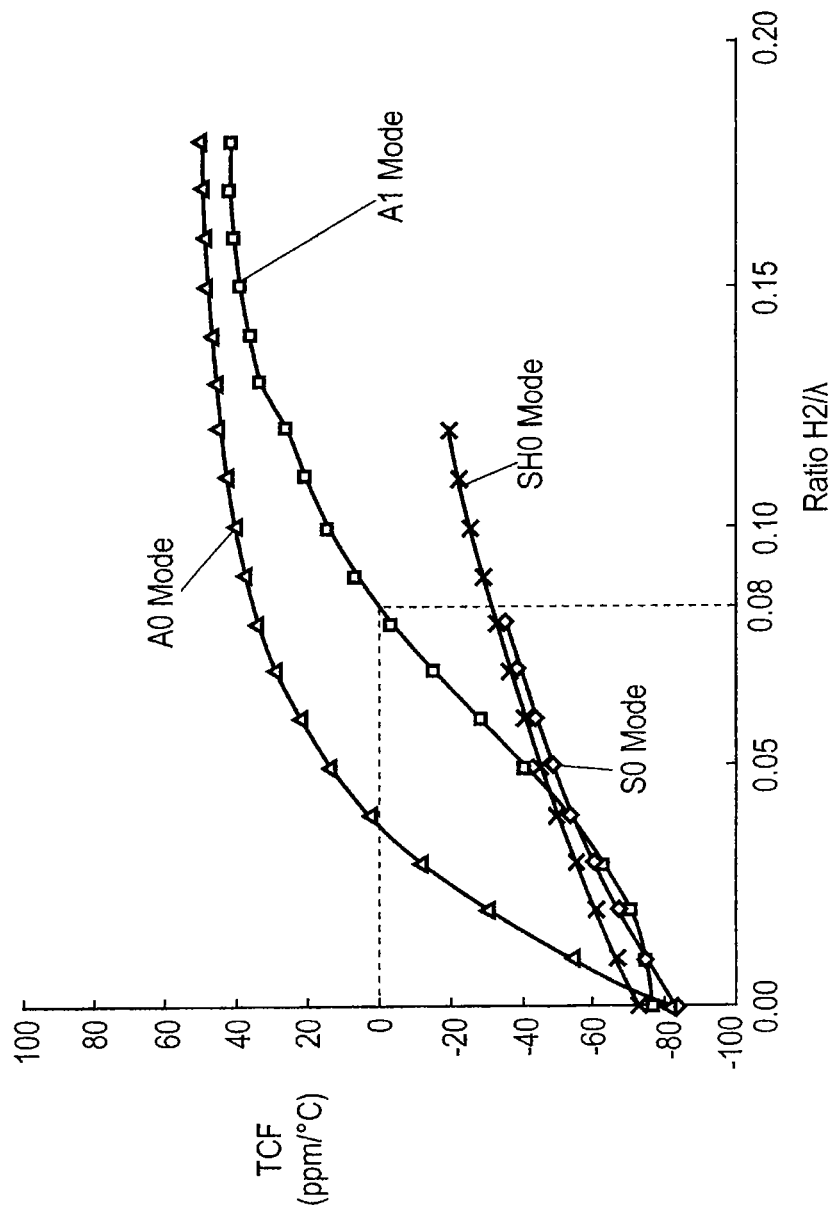
FIG. 3 shows a frequency temperature characteristic of the plate wave element in accordance with Embodiment 1.

FIG. 3 shows the relationship between frequency temperature coefficient TCF and ratio $H2/\lambda$ when ratio $H1/\lambda$ is 0.15 in plate wave element 105 of Embodiment shown in FIG. 1. Here, H2 is a thickness of medium layers 108 and 109, and $\lambda$ is the wavelength. As shown in FIG. 3, as thickness H2 increases, namely as ratio $H2/\lambda$ increases, the frequency temperature coefficients of the A0 mode and the A1 mode become smaller than those of the S0 mode and the SH0 mode, thus drastically improving the frequency temperature. The A0 mode reduces the sound speed and prevents a device from being applicable to high frequencies, so that it is preferable to use the A1 mode. When ratio $H2/\lambda$ is 0.08 in the A1 mode, the frequency temperature coefficient is zero. The decreasing of the frequency temperature coefficient and the improving of frequency temperature characteristic provides plate wave element 105 with a small characteristic degradation due to a temperature variation.

In the A1 mode and the A0 mode, the displacement is intensively distributed at upper surface 106A and lower surface 106B of piezoelectric body 106. Medium layers 108 and 109 made of silicon oxide have a frequency temperature characteristic opposite to that of piezoelectric body 106, namely have a frequency temperature coefficient having a sign opposite to that of the frequency temperature coefficient of piezoelectric body 106. The absolute value of the frequency temperature coefficient of medium layers 108 and 109 is preferably equal to that of piezoelectric body 106. Therefore, advantageously, the frequency temperature characteristic of piezoelectric body 106 is compensated by medium layers 108 and 109 that are disposed on upper surface 106A and lower surface 106B of piezoelectric body 106, respectively. When the anti-symmetric A1 mode is used and medium layers 108 and 109 are disposed on upper surface 106A and lower surface 106B of piezoelectric body 106 in the above-mentioned manner, the frequency temperature characteristic can be advantageously and largely improved comparing to an element using a surface wave mainly including a SH component, such as a pseudo surface elastic wave, or a surface wave, such as a Rayleigh wave.

Figure 4:
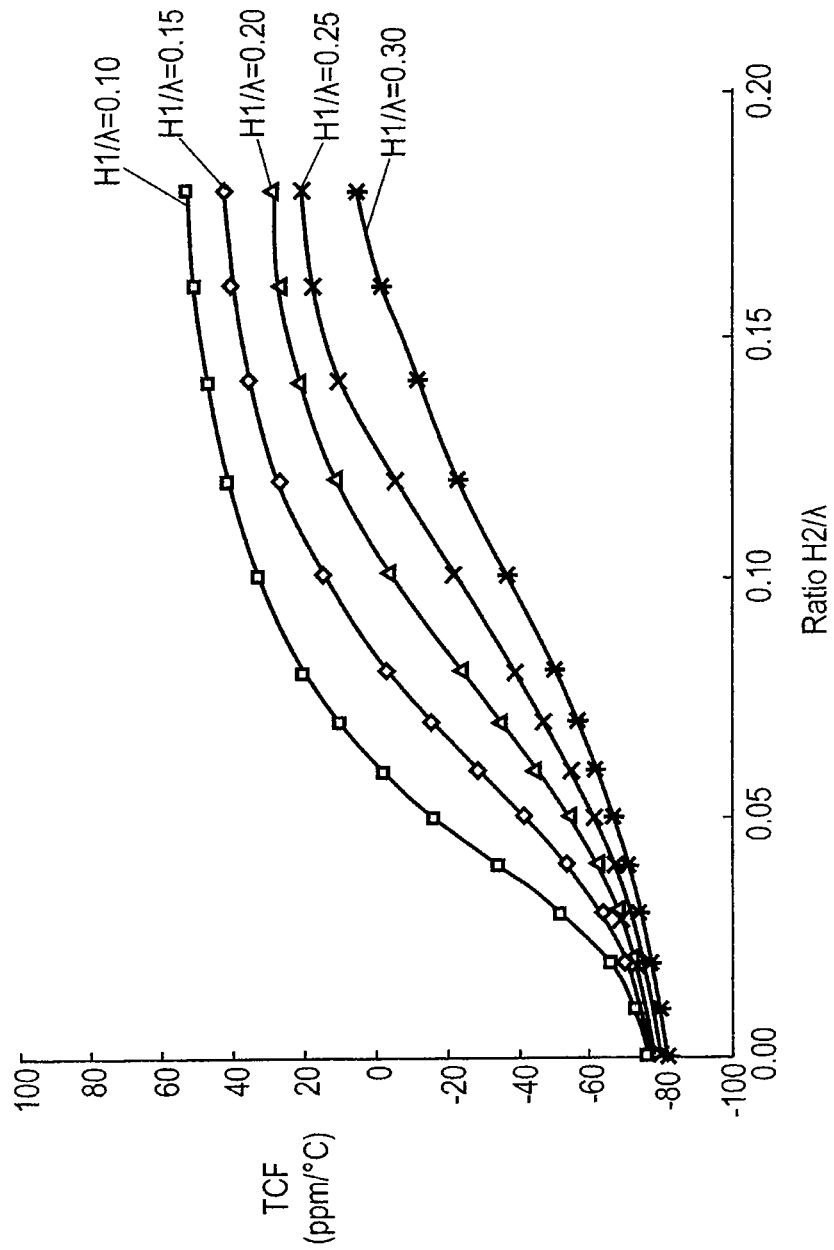
FIG. 4 shows a frequency temperature characteristic of the plate wave element in accordance with Embodiment 1.

FIG. 4 shows the relationship between frequency temperature coefficient (TCF) and ratio $H2/\lambda$ of thickness H2 of medium layers 108 and 109 to wavelength $\lambda$ in the A1 mode while thickness H1 of piezoelectric body 106 is changed. As shown in FIG. 4, as thickness H1 of piezoelectric body 106 decreases, the improving effect of the frequency temperature characteristic by medium layers 108 and 109 increases. In other words, in the case that ratio $H1/\lambda$ of thickness H1 of piezoelectric body 106 is 0.10, the frequency temperature coefficient is zero when ratio $H2/\lambda$ is 0.06. Similarly, in the case that ratio $H1/\lambda$ is 0.15, the frequency temperature coefficient is zero when ratio $H2/\lambda$ is 0.08. In the case that ratio $H1/\lambda$ is 0.20, the frequency temperature coefficient is zero when ratio $H2/\lambda$ is 0.10. In the case that ratio $H1/\lambda$ is 0.25, the frequency temperature coefficient is zero when ratio $H2/\lambda$ is 0.13. In the case that ratio $H1/\lambda$ is 0.30, the frequency temperature coefficient is zero when ratio $H2/\lambda$ is 0.16.

When the absolute value of the frequency temperature coefficient is not smaller than 20 ppm/° C., plate wave element 105 improves the characteristic of a duplexer having a small difference between transmitting and receiving frequencies.

In other words, according to the result shown in FIG. 4, ratio $H2/\lambda$ is determined to be 0.048 to 0.08 when ratio $H1/\lambda$ is 0.10. When ratio $H1/\lambda$ is 0.15, ratio $H2/\lambda$ is determined to be 0.067 to 0.108. When ratio $H1/\lambda$ is 0.20, ratio $H2/\lambda$ is determined to be 0.084 to 0.136. When ratio $H1/\lambda$ is 0.25, ratio $H2/\lambda$ is determined to be 0.103 to 0.175.

In order to actually produce plate wave element 105, the above-mentioned value of ratio $H1/\lambda$ is extended by the range of ±0.025, and this range is applied to ratio $H2/\lambda$. In other words, when ratio $H1/\lambda$ is 0.075 to 0.125, ratio $H2/\lambda$ is determined to be 0.048 to 0.080. When ratio $H1/\lambda$ is 0.125 to 0.175, ratio $H2/\lambda$ is determined to be 0.067 to 0.108. When ratio $H1/\lambda$ is 0.175 to 0.225, ratio $H2/\lambda$ is determined to be 0.084 to 0.136. When ratio $H1/\lambda$ is 0.225 to 0.275, ratio $H2/\lambda$ is determined to be 0.103 to 0.175.

Ratio $H1/\lambda$ and ratio $H2/\lambda$ determined to be in these ranges cause the absolute value of the frequency temperature coefficient to be not larger than 20 ppm/° C., thus providing plate wave element 105 with a preferable frequency temperature characteristic.

Figure 5:
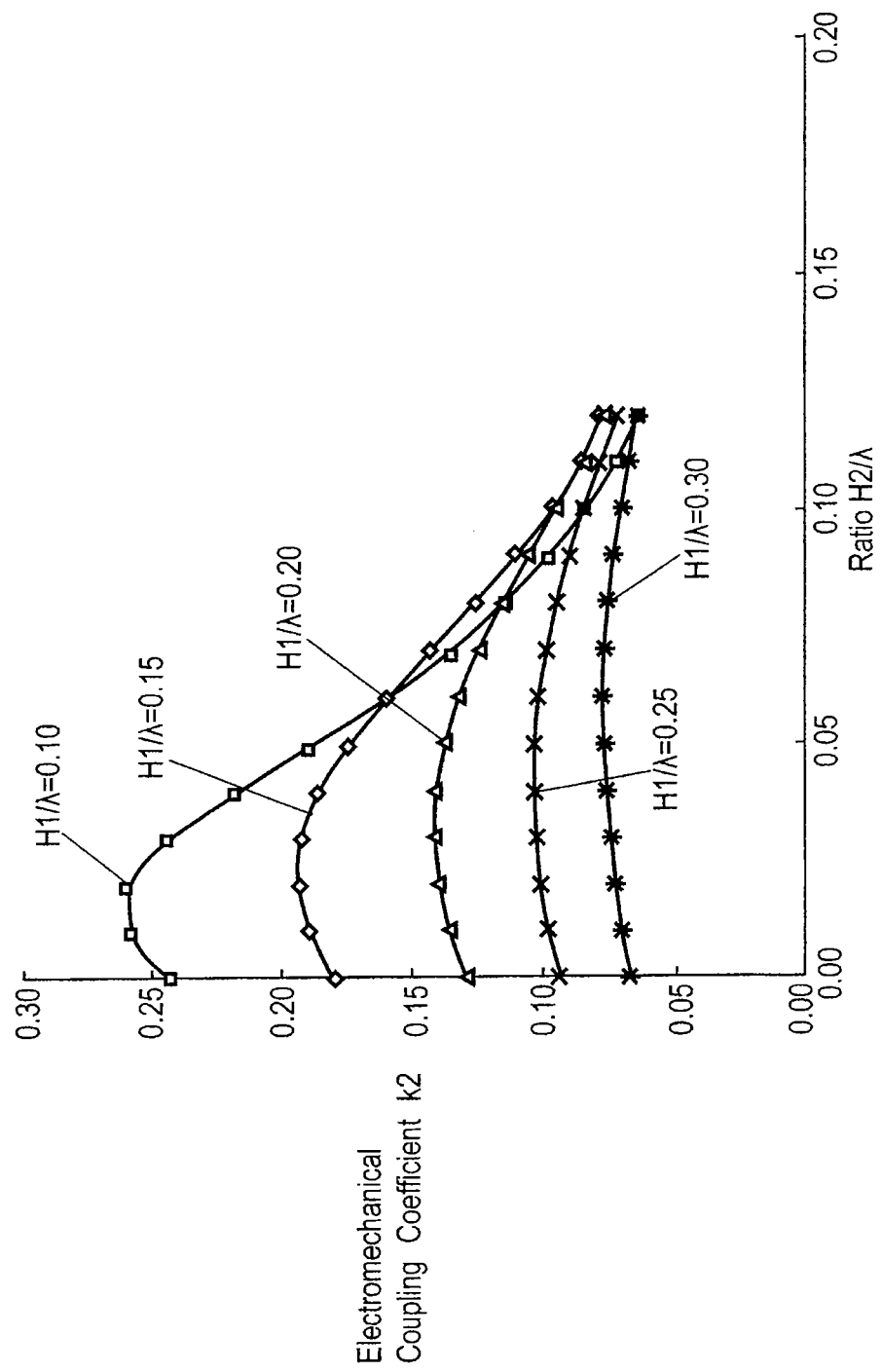
FIG. 5 shows a coupling coefficient of the plate wave element in accordance with Embodiment 1.

FIG. 5 shows the relationship between an electromechanical coupling coefficient and thickness H2 of medium layers 108 and 109 in the A1 mode when thickness H1 of piezoelectric body 106 is changed. As thickness H2 of medium layers 108 and 109 increases, electromechanical coupling coefficient k2 temporarily increases and then slightly decreases, thus having a local maximum value. In order to prevent electromechanical coupling coefficient k2 from decreasing, as shown in FIG. 5, ratio $H2/\lambda$ is determined to be larger than 0 and smaller than 0.032 when ratio $H1/\lambda$ is 0.10. When ratio $H1/\lambda$ is 0.15, ratio $H2/\lambda$ is determined to be larger than 0 and smaller than 0.046. When ratio $H1/\lambda$ is 0.20, ratio $H2/\lambda$ is determined to be larger than 0 and smaller than 0.061. When ratio $H1/\lambda$ is 0.25, ratio $H2/\lambda$ is determined to be larger than 0 and smaller than 0.084. When ratio $H1/\lambda$ is 0.30, ratio $H2/\lambda$ is determined to be larger than 0 and smaller than 0.110.

Similarly to FIG. 4, in order to actually produce plate wave element 105 based on the result shown in FIG. 5, the above-mentioned value of ratio $H1/\lambda$ is extended by the range of ±0.025, and this range is applied to ratio $H2/\lambda$.

In other words, when ratio $H1/\lambda$ is 0.075 to 0.125, ratio $H2/\lambda$ is determined to be larger than 0 and smaller than 0.032. When ratio $H1/\lambda$ is 0.125 to 0.175, ratio $H2/\lambda$ is determined to be larger than 0 and smaller than 0.046. When ratio $H1/\lambda$ is 0.175 to 0.225, ratio $H2/\lambda$ is determined to be larger than 0 and smaller than 0.061. When ratio $H1/\lambda$ is 0.225 to 0.275, ratio $H2/\lambda$ is determined to be larger than 0 and smaller than 0.084. When ratio $H1/\lambda$ is 0.275 to 0.325, ratio $H2/\lambda$ is determined to be larger than 0 and smaller than 0.110.

Ratio $H1/\lambda$ and ratio $H2/\lambda$ in these ranges improve the frequency temperature characteristic of plate wave element 105 without decreasing electromechanical coupling coefficient k2 due to medium layers 108 and 109.

According to Embodiment 1, medium layers 108 and 109 are disposed on upper surface 106A and lower surface 106B of piezoelectric body 106, respectively. However, the plate wave element according to Embodiment 1 does not necessarily include one of medium layers 108 and 109. This structure can also improve the frequency temperature characteristic.

In the case that piezoelectric body 106 is a piezoelectric single-crystal substrate cut while normal direction N101 of upper surface 106A matches with the c-axis of the crystal, the coupling coefficient of the A1 mode of plate wave element 105 can be increased effectively.

In the case that the crystal structure of piezoelectric body 106 is a rotation twin crystal about the c-axis matching with the normal direction N101 of upper surface 106A, plate wave element 105 increases the coupling coefficient of the A1 mode effectively, and prevents the symmetric SH0 mode from being excited and appearing as a spurious response.

Figure 6:
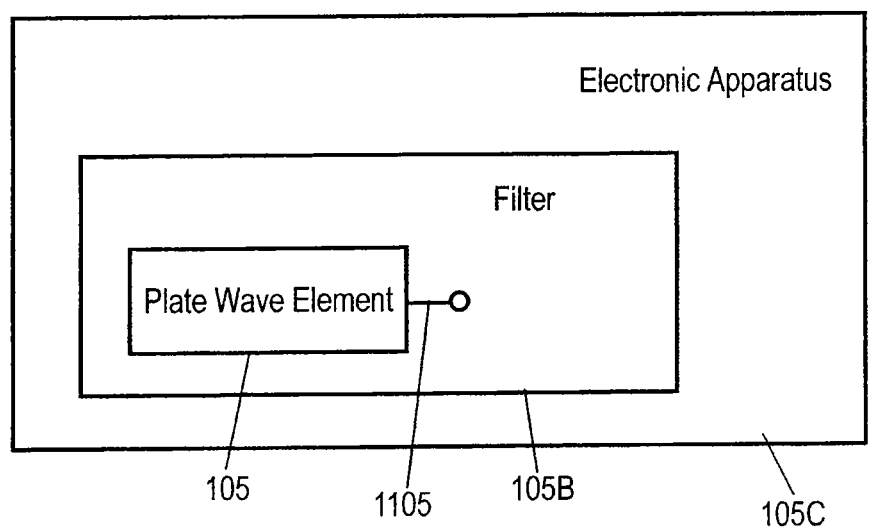
FIG. 6 is a block diagram of a device having the plate wave element in accordance with Embodiment 1.

FIG. 6 is a block diagram of electronic device 105C including plate wave element 105 in accordance with Embodiment 1. Filter 105B, such as a ladder type filter or a data management system (DMS) filter, includes plate wave element 105 as a resonator. Electronic device 105C, such as a portable phone, includes filter 105B, a semiconductor integrated circuit element connected to filter 105B, and a reproducing device connected to the semiconductor integrated circuit element. Electronic device 105C includes signal line 1105 connected to plate wave element 105. Thus, signal loss in the resonator (plate wave element 105), filter 105B, and electronic device 105C can be suppressed. Plate wave element 105 has a high frequency temperature characteristic, and can be applied to the filter or duplexer in electronic device 105C, such as a portable phone.

Exemplary Embodiment 2

Figure 7:
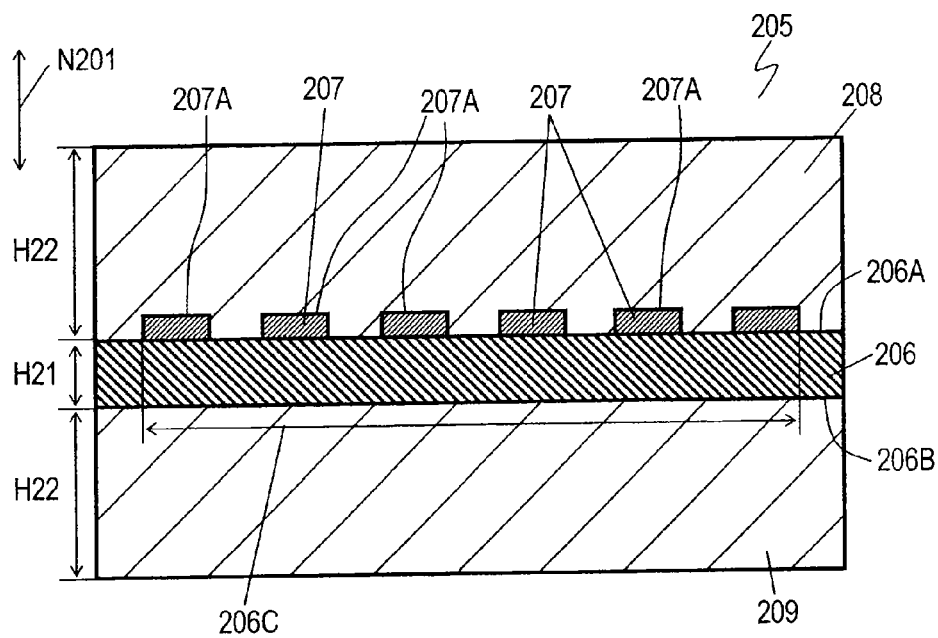
FIG. 7 is a schematic sectional view of a plate wave element in accordance with Exemplary Embodiment 2 of the invention.

FIG. 7 is a schematic sectional view of plate wave element 205 in accordance with Exemplary Embodiment 2. Plate wave element 205 includes piezoelectric body 206, comb-shaped electrode 207 disposed on upper surface 206A of piezoelectric body 206, medium layer 208 disposed on upper surface 206A of piezoelectric body 206 and upper surface 207A of comb-shaped electrode 207 so as to cover comb-shaped electrode 207, and medium layer 209 disposed on lower surface 206B of piezoelectric body 206. Comb-shaped electrode 207 is disposed in exciting region 206C of upper surface 206A of piezoelectric body 206. Medium layer 209 is positioned directly below exciting region 206C. Piezoelectric body 206, comb-shaped electrode 207, and medium layers 208 and 209 are stacked in normal direction N201 perpendicular to upper surface 206A and lower surface 206B of piezoelectric body 206. Piezoelectric body 206 has thickness H21 in normal direction N201. Each of medium layers 208 and 209 has thickness H22 in normal direction N201. It is assumed that the thicknesses of medium layers 208 and 209 in normal direction N201 have the same thickness H22, but the thicknesses may be different from each other. Medium layer 209 faces comb-shaped electrode 207 across piezoelectric body 206. Comb-shaped electrode 207 has thickness T11 in normal direction N201. A transverse wave propagates through medium layer 208 at a speed higher than that of a plate wave excited by comb-shaped electrode 207. A transverse wave propagates through medium layer 209 at a speed higher than that of a plate wave propagating through piezoelectric body 206.

The plate wave is one of bulk waves, and is an elastic wave that propagates while repetitively reflected between upper surface 206A and lower surface 206B of piezoelectric body 206. The plate wave includes a Lamb wave having high speed-dispersibility and an SH wave mainly including a transverse wave component. The Lamb wave is a plate wave generated by an SV wave and a longitudinal wave (compressional wave) that cause mode change on the upper and lower surfaces of piezoelectric body 206 and that are complicatedly coupled with each other.

Piezoelectric body 206 is formed of a lithium niobate single-crystal substrate of Z-cut X-propagation according to Embodiment 2. However, piezoelectric body 206 may be formed of a lithium tantalate single-crystal substrate or a potassium niobate single-crystal substrate. Piezoelectric body 206 may be formed of a piezoelectric thin film instead of the single-crystal substrate.

Comb-shaped electrode 207 is made of aluminum according to Embodiment 2; however, comb-shaped electrode 207 may be made of an alloy mainly containing aluminum, single metal of copper, silver, or gold, or an alloy mainly containing them.

Medium layers 208 and 209 are made of at least one of diamond, silicon, silicon nitride, aluminum nitride, and aluminum oxide.

Thickness H21 of piezoelectric body 206 and thickness T11 of comb-shaped electrode 207 are determined such that the speed of the plate wave propagating through piezoelectric body 206 is lower than that of a transverse wave propagating through medium layers 208 and 209.

In plate wave element 205, the transverse wave propagates through medium layers 208 and 209 at a speed higher than the speed of the plate wave excited by comb-shaped electrode 207, so that the effect of trapping the plate wave in piezoelectric body 206 is produced. Here, piezoelectric body 206 is sandwiched between medium layers 208 and 209 across upper surface 206A and lower surface 206B. This effect will be described in detail below.

Figure 8:
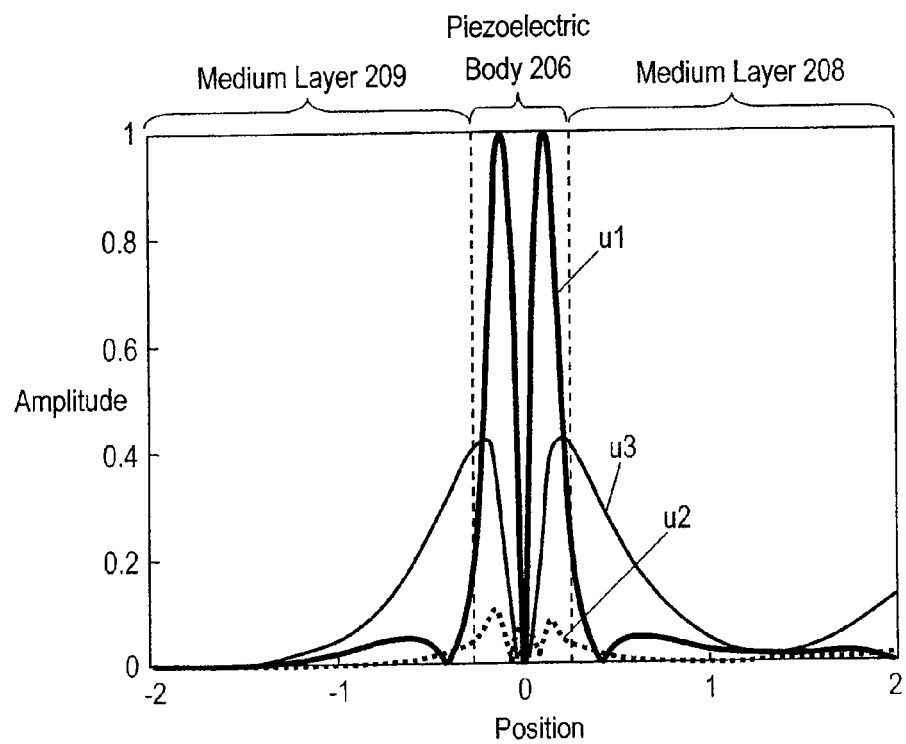
FIG. 8 shows a displacement distribution of a main wave in the plate wave element in accordance with Embodiment 2.

The distribution of the displacement of the plate wave excited by comb-shaped electrode 207 is confirmed when piezoelectric body 206 is made of lithium niobate and medium layers 208 and 209 are made of diamond. FIG. 8 shows the result. In FIG. 8, the vertical axis represents amplitude of the displacement normalized with respect to the peak value. The horizontal axis represents a distance from the center of piezoelectric body 206 in normal direction N201. The distance is normalized with respect to wavelength λ of the propagating plate wave, namely the position normalized to wavelength λ. In FIG. 8, the positive direction of the horizontal axis represents the direction from piezoelectric body 206 toward medium layer 208, and the negative direction of the horizontal axis represents the direction from piezoelectric body 206 toward medium layer 209. Comb-shaped electrode 207 excites piezoelectric body 206, and generates a plate wave having wavelength λ propagating in piezoelectric body 206. The thickness of piezoelectric body 206 is 0.4λ and the thickness of medium layers 208 and 209 is 2λ. Thus, thickness H22 of medium layers 208 and 209 is larger than wavelength λ of the plate wave. The amplitude is calculated using an analysis method by Campbell et al., and the constant by Smith et al. is used as a material constant of lithium niobate. In FIG. 8, the displacement of the propagating plate wave has three components u1, u2, and u3 perpendicular to each other. Component u1 of the displacement is a component in the direction that is parallel with upper surface 206A and lower surface 206B of piezoelectric body 206 and the plate wave propagates in. Component u2 of the displacement is a component in the direction that is parallel with upper surface 206A and lower surface 206B of piezoelectric body 206 and is perpendicular to component u1. Component u3 of the displacement is a component in normal direction N201 perpendicular to upper surface 206A and lower surface 206B of piezoelectric body 206. In other words, component u3 is perpendicular to components u1 and u2. The propagation mode of the plate wave is the anti-symmetric A1 mode mainly including component u1. As shown in FIG. 8, energy of the plate wave concentrates to piezoelectric body 206. Thickness H22 of medium layers 208 and 209 is not smaller than 1λ causes the plate wave to sufficiently attenuate on upper surface 208A of medium layer 208 and on lower surface 209B of medium layer 209.

Figure 17:
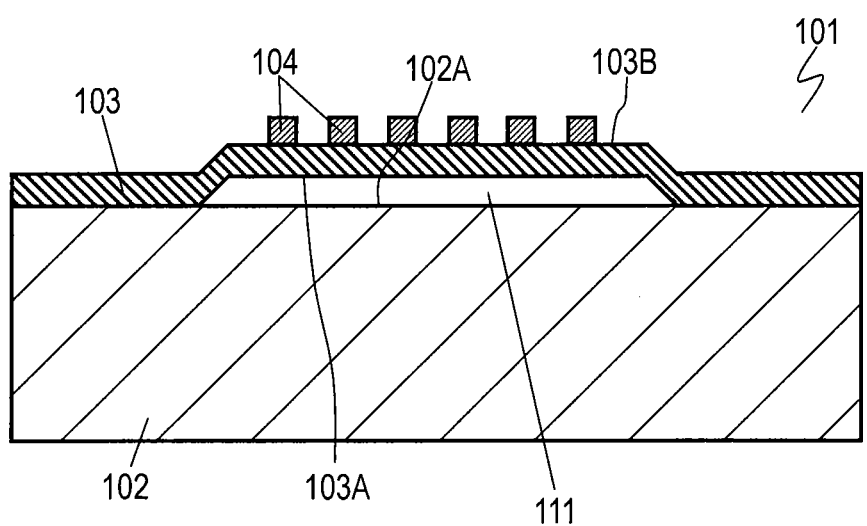
FIG. 17 is a schematic sectional view of a conventional plate wave element.

In order to propagate the plate wave through conventional plate wave element 101 shown in FIG. 17, space 111 between surface 103A of piezoelectric body 103 facing base substrate 102 and surface 102A of base substrate 102 facing piezoelectric body 103 is necessary. A package is additionally necessary for protecting surface 103B of piezoelectric body 103 having comb-shaped electrode 104, hence causing plate wave element 101 to be thick. Piezoelectric body 103 is extremely thin and has small strength accordingly.

In plate wave element 205 of Embodiment 2, the plate wave sufficiently attenuates on upper surface 208A of medium layer 208 and lower surface 209B of medium layer 209. Therefore, medium layers 208 and 209 can be used as a package, hence providing thin plate wave element 205 with no space inside.

In plate wave element 205 of Embodiment 2, a plate wave having a speed higher than speeds of a surface elastic wave element and a boundary wave element that are conventionally used as a piezoelectric element can be excited as a main wave.

For example, in a surface acoustic wave element and boundary wave element that use lithium niobate as the piezoelectric body and have, as a main wave, a surface wave such as a leaky wave, the main wave often leaks to a thick piezoelectric body when the speed of the wave excited by the comb-shaped electrode is not lower than 4024 m/s. However, since the plate wave propagates as the main wave in plate wave element 205 of Embodiment 2, the leak of the wave to piezoelectric body 206 does not need to be considered, and high-sound-speed elastic wave can be excited. Medium layers 208 and 209 are made of a medium through which the transverse wave propagates at a speed higher than the sound speed of the main wave, hence suppressing the leak of the main wave to medium layers 208 and 209. In other words, in plate wave element 205 of Embodiment 2, a signal can be transferred by the following elastic wave, and the elastic wave element where performance degradation by leak is suppressed can be achieved. Here, the elastic wave propagates at a speed of 4024 m/s or higher that cannot be obtained by the boundary wave element where the surface wave is the main wave.

Thicknesses of medium layers 208 and 209 are substantially identical to each other. This arrangement prevents plate wave element 205 from warping due to a stress.

Medium layers 208 and 209 are made of medium substantially identical to each other. This prevents plate wave element 205 from warping due to a stress.

The crystal structure of piezoelectric body 206 is preferably a rotation twin crystal about a c-axis while normal direction N201 of upper surface 206A matches with the c-axis. This structure suppresses excitation of the symmetric SH0 mode and the S0 mode, preventing the excitation from appearing as a spurious response.

Figure 9:
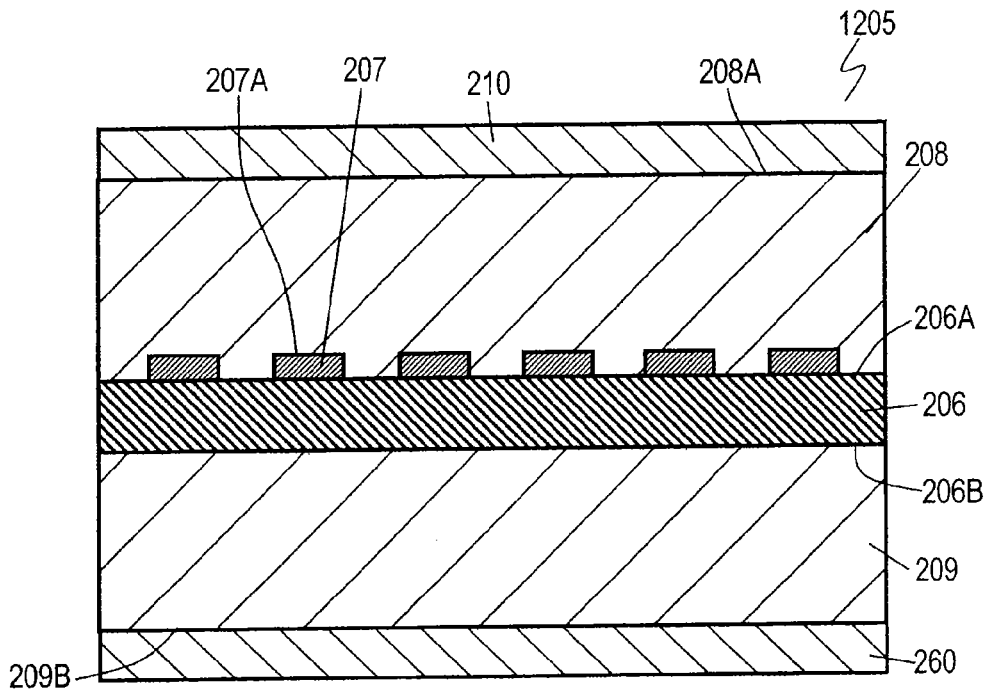
FIG. 9 is a schematic sectional view of another plate wave element in accordance with Embodiment 2.

FIG. 9 is a schematic sectional view of another plate wave element 1205 in accordance with Embodiment 2. In FIG. 9, components identical to those of plate wave element 205 in FIG. 7 are denoted by the same reference numerals, and their descriptions will be omitted. Plate wave element 1205 shown in FIG. 203 further includes sound absorbing layer 210 that is disposed on upper surface 208A of medium layer 208 and sound absorbing layer 260 that is disposed on lower surface 209B of medium layer 209. Sound absorbing layers 210 and 260 are made of resin, such as resist. An undesired wave of high-order mode of high frequency may be generated when a plate wave propagates as a main wave. Sound absorbing layers 210 and 260 can guides the undesired wave into sound absorbing layers 210 and 260 via medium layers 208 and 209 to suppress the wave.

Figure 10:
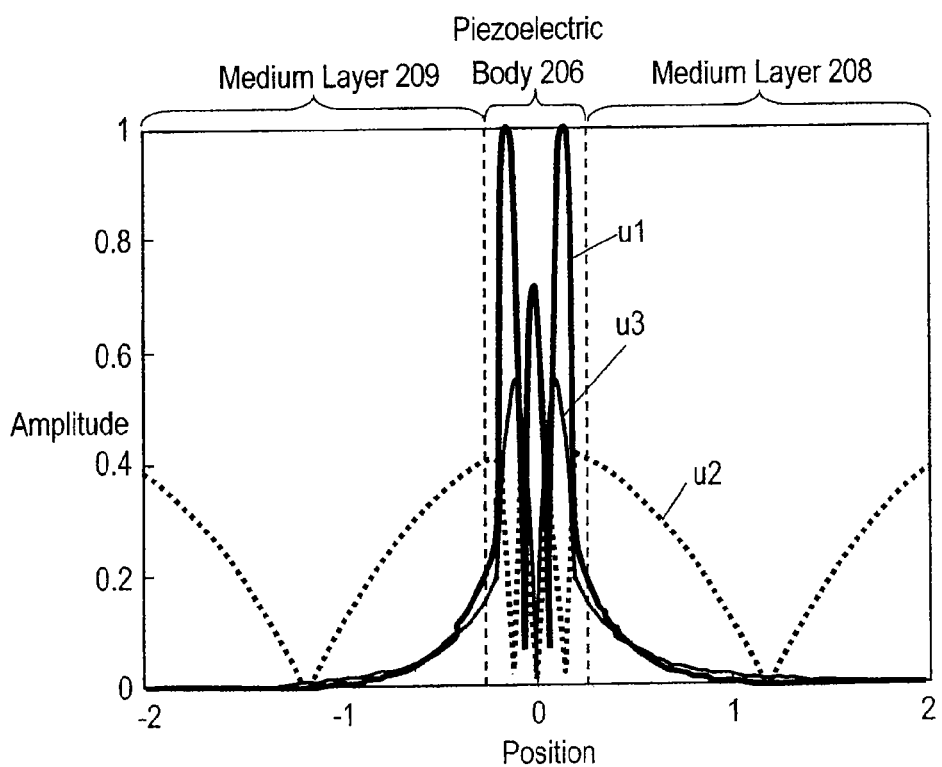
FIG. 10 shows a displacement distribution of high-order modes in the plate wave element shown in FIG. 9.

FIG. 10 shows the distribution of the displacement of the high-order mode determined by experiments. Similarly to FIG. 8, in FIG. 10, the vertical axis represents amplitude of the displacement normalized with respect to the peak value, and the horizontal axis represents a position in normal direction N201 that is normalized with respect to wavelength $\lambda$. The symmetric S2 mode mainly including component u1 of the propagation direction of the plate wave is selected as a propagation mode of high-order mode. As shown in FIG. 10, the propagation speed of a wave of high-order mode is higher than the speed of the transverse wave that propagates through medium layers 208 and 209, so that component u2 of the displacement of high-order mode remains while being not attenuating even at upper surface 208A of medium layer 208 and lower surface 209B of medium layer 209. Therefore, the structure of the medium layers and the structure of the electrode are determined such that the speed of the wave of high-order mode is higher than a speed of the transverse wave that propagates through medium layers 208 and 209. This arrangement allows the wave of high-order mode to be guided into sound absorbing layers 210 and 260, and suppresses the wave. The speed of the transverse wave of high-order mode that propagates through sound absorbing layers 210 and 260 is lower than a speed of the transverse wave that propagates through medium layers 208 and 209. This arrangement prevents a wave that enters sound absorbing layers 210 and 260 via medium layers 208 and 209 from returning to medium layers 208 and 209, thereby allowing sound absorbing layers 210 and 260 to effectively absorb the wave. The transverse wave propagates at a speed higher through medium layers 208 and 209 than the speed of the main wave propagating through medium layers 208 and 209. Therefore, the main wave is trapped in a part of medium layers 208 and 209 that is close to piezoelectric body 206, and can be prevented from being absorbed by sound absorbing layers 210 and 260.

Figure 11:
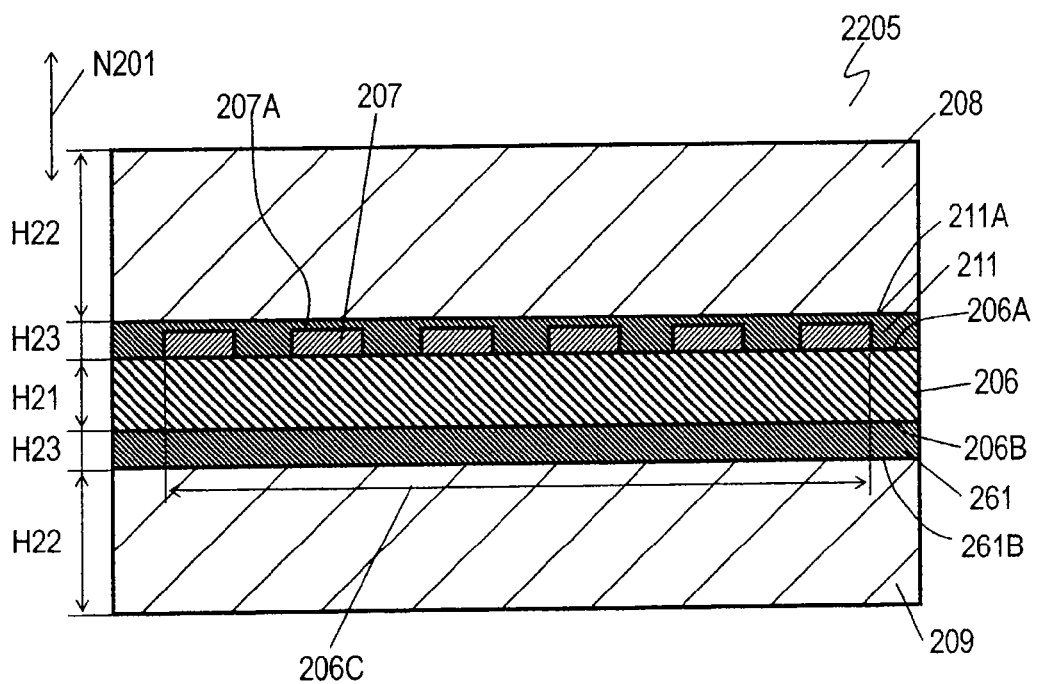
FIG. 11 is a schematic sectional view of still another plate wave element in accordance with Embodiment 2.

FIG. 11 is a schematic sectional view of further plate wave element 2205 in accordance with Embodiment 2. In FIG. 11, components identical to those of plate wave element 205 shown in FIG. 7 are denoted by the same reference numerals, and their descriptions will be omitted. Plate wave element 2205 shown in FIG. 11 further includes medium layer 211 that is disposed between medium layer 208 and piezoelectric body 206 and medium layer 261 that is disposed between medium layer 209 and piezoelectric body 206. In other words, plate wave element 2205 includes piezoelectric body 206, comb-shaped electrode 207 disposed on upper surface 206A of piezoelectric body 206, medium layer 211 disposed on upper surface 206A of piezoelectric body 206 and upper surface 207A of comb-shaped electrode 207 so as to cover comb-shaped electrode 207, medium layer 208 disposed on upper surface 211A of medium layer 211, medium layer 261 disposed on lower surface 206B of piezoelectric body 206, and medium layer 209 disposed on lower surface 261B of medium layer 261. Comb-shaped electrode 207 is disposed in exciting region 206C of upper surface 206A of piezoelectric body 206. Medium layers 261 and 209 are positioned directly below exciting region 206C. Medium layer 208 is positioned directly above exciting region 206C. Piezoelectric body 206, comb-shaped electrode 207, and medium layers 208, 209, 211, and 261 are stacked in normal direction N201 perpendicular to upper surface 206A and lower surface 206B of piezoelectric body 206. Piezoelectric body 206 has thickness H21 in normal direction N201. Medium layers 208 and 209 have thickness H22 in normal direction N201. Medium layers 211 and 261 have thickness H23 in normal direction N201. Medium layer 261 faces comb-shaped electrode 207 across piezoelectric body 206. Comb-shaped electrode 207 has thickness T11 in normal direction N201. Plate wave element 2205 may not include one of medium layers 211 and 261. In other words, one of medium layers 208 and 209 may contact piezoelectric body 206. Medium layers 211 and 261 are low-sound-speed layers through which a transverse wave propagates at a speed lower than the speed of a transverse wave that propagates through medium layers 208 and 209. This structure increases a coupling coefficient of plate wave element 205. This will be described below.

Figure 12:
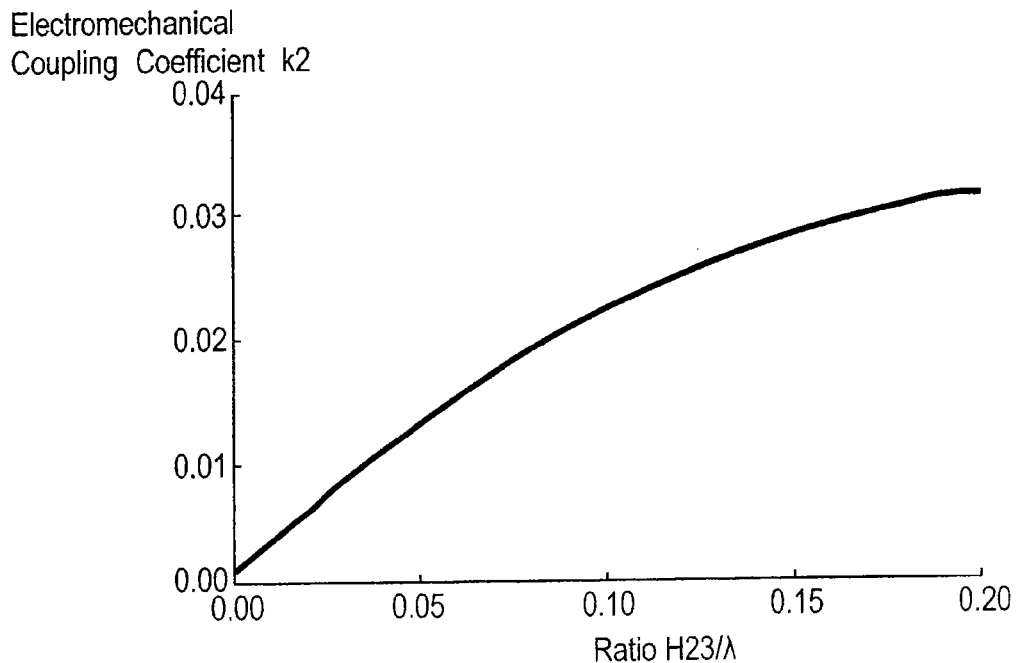
FIG. 12 shows an electromechanical coupling coefficient of a main wave in the plate wave element shown in FIG. 11.
Figure 13:
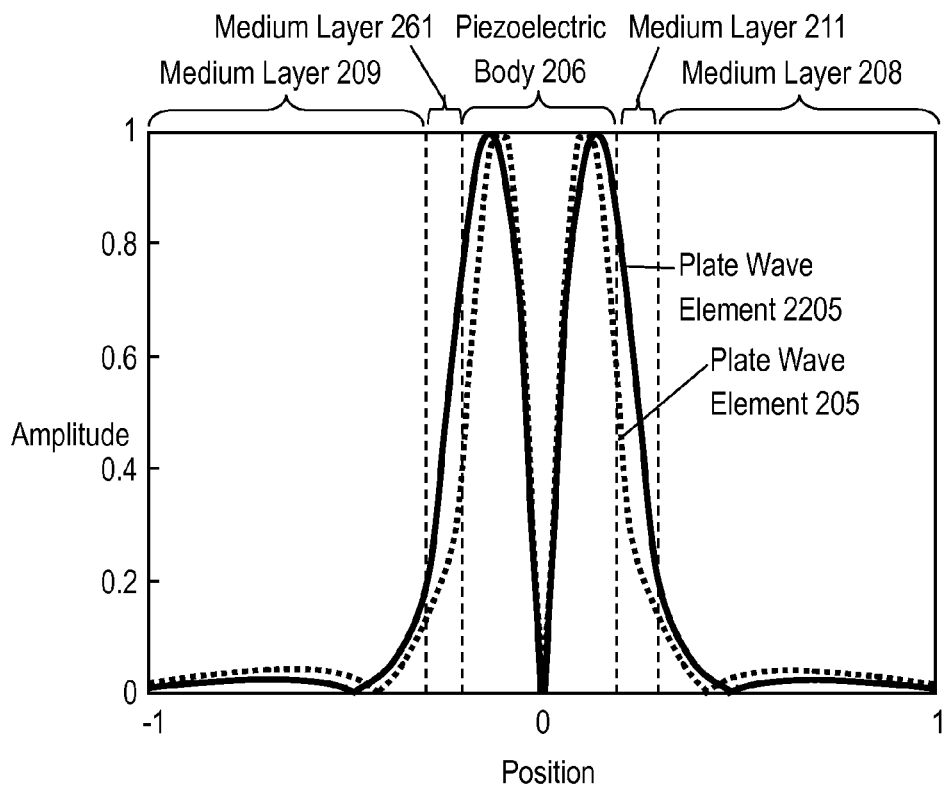
FIG. 13 shows a displacement distribution of high-order modes in the plate wave element shown in FIG. 11.

The plate wave excited in piezoelectric body 206 by comb-shaped electrode 207 has wavelength $\lambda$. Ratio H21/$\lambda$ of thickness H21 of piezoelectric body 206 made of lithium niobate to wavelength $\lambda$ is determined to be 0.4. Ratio H22/$\lambda$ of thickness H22 of medium layer 208 and medium layer 209 that are made of diamond to wavelength $\lambda$ is determined to be 2. Medium layers 211 and 261 are made of silicon oxide. FIG. 12 shows the experimental result of electromechanical coupling coefficient k2 of plate wave element 205 when thickness H23 of medium layers 211 and 261 is changed. In FIG. 12, the vertical axis represents electromechanical coupling coefficient k2 of plate wave element 205, and the horizontal axis represents thickness H23 of medium layers 211 and 261 normalized with respect to wavelength $\lambda$ of the main wave, namely ratio H23/$\lambda$. In FIG. 12, the plate wave element having ratio H23/$\lambda$ of zero is plate wave element 205 shown in FIG. 7. As shown in FIG. 12, as thickness H23 of medium layers 211 and 261 increases, electromechanical coupling coefficient k2 of plate wave element 205 increases thus being extremely improved. FIG. 13 shows the experimental result of the displacement distribution of plate wave element 205 that does not include medium layers 211 and 261 as low-sound-speed layers, and shows the displacement distribution of plate wave element 2205 that include medium layers 211 and 206 having thickness H23 in which ratio H23/$\lambda$ is 0.1. Similarly to FIG. 8, in FIG. 13, the vertical axis represents amplitude normalized with respect to the peak value, and the horizontal axis represents the position in normal direction N201 normalized with respect to wavelength $\lambda$. As shown in FIG. 13, medium layers 211 and 261 as low-sound-speed layers cause the peak of the displacement distribution to be close to the boundary surface between medium layer 211 and piezoelectric body 206 having comb-shaped electrode 207. The concentrating of the displacement distribution on the periphery of comb-shaped electrode 207 can increase electromechanical coupling coefficient k2 of plate wave element 205.

Medium layers 211 and 261 are formed of a dielectric material, such as silicon oxide, that has a frequency temperature characteristic opposite to that of piezoelectric body 206, thereby decreasing the frequency temperature coefficient of plate wave element 2205 and improving the frequency temperature characteristic.

In the case that piezoelectric body 206 is a single crystal substrate, medium layer 209 can be joined to piezoelectric body 206 by a technology, such as direct joint. In the piezoelectric body 206 is formed of a thin film, a buffer layer allowing piezoelectric body 206 to be orientated is disposed on the upper surface of medium layer 209. A piezoelectric thin film to be piezoelectric body 206 can be formed on an upper surface of the buffer layer by a technology, such as sputtering or chemical vapor deposition (CVD). Medium layer 209, upon being made of a material, such as glass, sapphire, or silicon, that has a small thermal expansion coefficient, provides plate wave element 205 with a small frequency temperature coefficient and a preferable frequency temperature characteristic.

Figure 14:
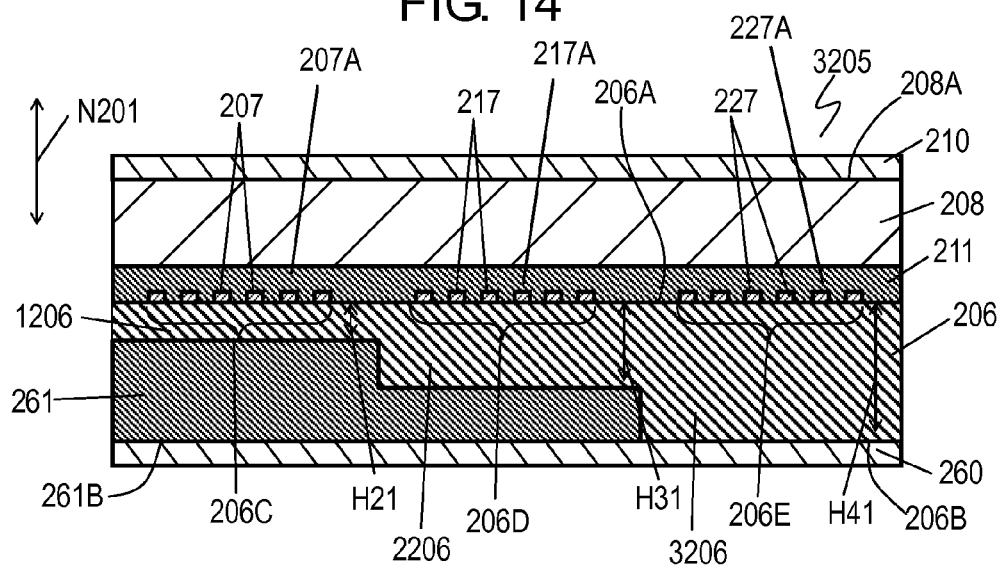
FIG. 14 is a schematic sectional view of a further plate wave element in accordance with Embodiment 2.

FIG. 14 is a schematic sectional view of further plate wave element 3205 in accordance with Embodiment 2. In FIG. 14, components identical to those of plate wave element 2205 shown in FIG. 11 are denoted by the same reference numerals, and their description will be omitted. In plate wave element 3205 shown in FIG. 14, upper surface 206A of piezoelectric body 206 further has exciting regions 206D and 206E in addition to exciting region 206C. Comb-shaped electrodes 217 and 227 are disposed in exciting regions 206D and 206E of upper surface 206A, respectively. Medium layer 211 is disposed on upper surface 206A of piezoelectric body 206 and on upper surfaces 207A, 217A, and 227A of comb-shaped electrodes 207, 217, and 227 so as to cover comb-shaped electrodes 207, 217, and 227. Portion 1206 of piezoelectric body 206 that is included in exciting region 206C has thickness H21 in normal direction N201. Portion 2206 of piezoelectric body 206 that is included in exciting region 206D has thickness H31 in normal direction N201. Portion 3206 of piezoelectric body 206 that is included in exciting region 206E has thickness H41 in normal direction N201. Thicknesses H21, H31, and H41 of piezoelectric body 206 are different from each other. Thickness H21 is smaller than thickness H31, and thickness H31 is smaller than thickness H41. Sound absorbing layer 210 of plate wave element 1205 shown in FIG. 9 is disposed on upper surface 208A of medium layer 208. Medium layer 261 is disposed on lower surface 206B of piezoelectric body 206 in portions 1206 and 2206. Medium layer 261 is not disposed on lower surface 206B of piezoelectric body 206 in part 3206. Sound absorbing layer 260 of plate wave element 1205 shown in FIG. 9 is disposed on lower surface 261B of medium layer 261 and on lower surface 206B of the piezoelectric body in portion 3206. Thicknesses H21, H31, and H41 of piezoelectric body 206 are different from each other in exciting regions 206C, 206D and 206E having comb-shaped electrodes 207, 217, and 227, hence providing characteristics of plural different plate wave elements in single plate wave element 3205.

Figure 15:
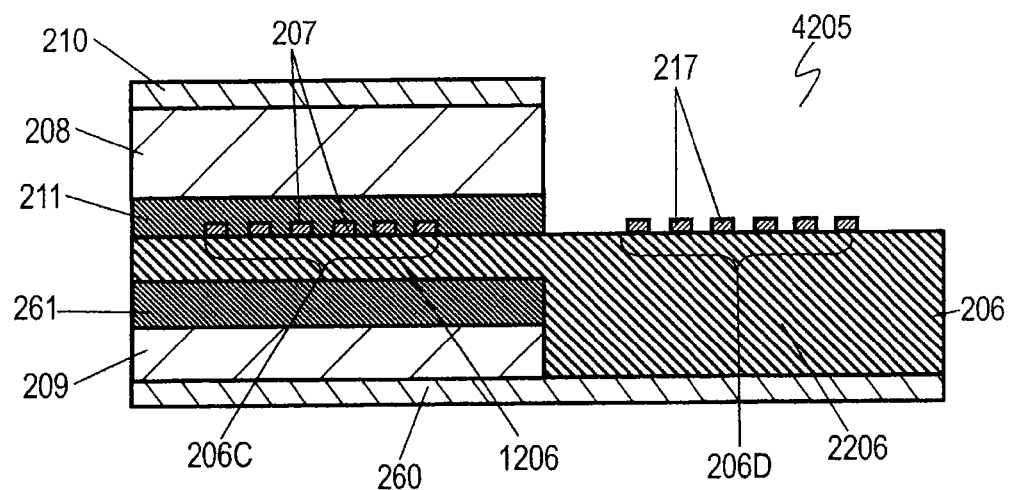
FIG. 15 is a schematic sectional view of a further plate wave element in accordance with Embodiment 2.

FIG. 15 is a schematic sectional view of further plate wave element 4205 in accordance with Embodiment 2. In 15, components identical to those of plate wave element 3205 shown in FIG. 14 are denoted by the same reference numerals, and their description will be omitted. In plate wave element 4205 shown in FIG. 15, comb-shaped electrode 217 and exciting region 206D of upper surface 206A of piezoelectric body 206 are exposed. In exciting region 206D, a surface acoustic excited by comb-shaped electrode 217 propagates in exciting region 206D. Portion 2206 of piezoelectric body 206 functions as a surface acoustic wave element. Thus, plate wave element 4205 functions as a hybrid element including a plate wave element and a surface acoustic wave element.

Figure 16:
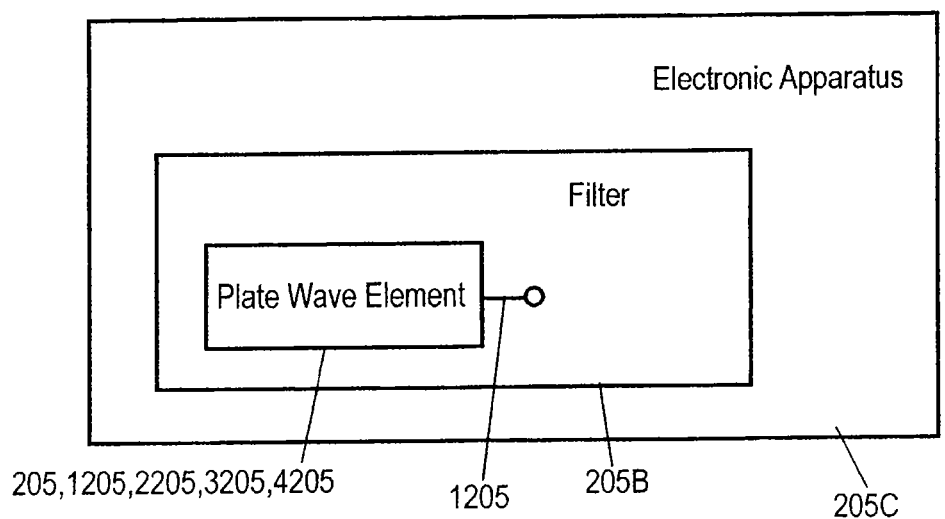
FIG. 16 is a block diagram of a device having the plate wave element in accordance with Embodiment 2.

FIG. 16 is a block diagram of electronic device 205C including plate wave element 205 (1205 to 4205) in accordance with Embodiment 2. Filter 205B, such as a ladder type filter or a DMS filter, includes plate wave element 205 (1205 to 4205) as a resonator. Electronic device 205C, such as a portable phone, includes filter 205B, a semiconductor integrated circuit element connected to filter 205B, and a reproducing device connected to the semiconductor integrated circuit element. Electronic device 205C includes signal line 1205 connected to plate wave element 205 (1205 to 4205). Signal loss in a resonator (plate wave elements 205 and 1205 to 4205), filter 205B, and electronic device 205C can be suppressed. Plate wave element 205 (1205 to 4205) has a preferable frequency temperature characteristic, and can be applied to a filter or duplexer in electronic device 205C, such as a portable phone.

The terms, such as "upper surface", "lower surface", "upward", "directly above", "downward", and "directly below", indicating directions indicate relative directions that depend on only a relative positional relation of components, such as a piezoelectric body and a comb-shaped electrode, of a plate wave element, and do not indicate absolute directions, such as a vertical direction.

INDUSTRIAL APPLICABILITY

The plate wave element of the present invention has a high frequency temperature characteristic, and can be applied to a filter or a duplexer in an electronic device, such as a portable phone.

REFERENCE MARKS IN THE DRAWINGS

106 Piezoelectric Body
107 Comb-Shaped Electrode
108 Medium Layer (First Medium Layer)
109 Medium Layer (Second Medium Layer)
206 Piezoelectric Body
207 Comb-Shaped Electrode
208 Medium Layer (First Medium Layer, Third Medium Layer)
209 Medium Layer (Second Medium Layer, Fourth Medium Layer)
210 Sound Absorbing Layer (First Absorbing Layer)
260 Sound Absorbing Layer (Second Absorbing Layer)
211 Medium Layer (First Medium Layer)
261 Medium Layer (Second Medium Layer)

The invention claimed is:
1. A plate wave element comprising:
a piezoelectric body;
a comb-shaped electrode disposed on an upper surface of the piezoelectric body, the comb-shaped electrode exciting a Lamb wave as a main wave;
a first medium layer disposed on the upper surface of the piezoelectric body so as to cover the comb-shaped electrode; and
a second medium layer that is disposed on a lower surface of the piezoelectric body
wherein the first medium layer is made of silicon oxide,
the piezoelectric is made of lithium niobate, a thickness H1 of the piezoelectric body, a wavelength $\lambda$ of the Lamb wave, and a thickness H2 of the first medium layer satisfy a condition that,
when a ratio $H1/\lambda$ is not less than 0.075 less than 0.125, a ratio $H2/\lambda$ is 0.048 to 0.080,
when the ratio $H1/\lambda$ is not less than 0.125 less than 0.175, the ratio $H2/\lambda$ is 0.067 to 0.108,
when the ratio $H1/\lambda$ is not less than 0.175 less than 0.225, the ratio $H2/\lambda$ is 0.084 to 0.136, and
when ratio $H1/\lambda$ is not less than 0.225 less than 0.275, ratio $H2/\lambda$ is set at 0.103 to 0.175.
2. The plate wave element of claim 1, wherein the piezoelectric body is formed of a piezoelectric single-crystal substrate cut by a plane whose normal is a c-axis of the crystal structure.

3. The plate wave element of claim 2, wherein a crystal structure of the piezoelectric body is a rotation twin crystal about a normal of the upper surface of the piezoelectric body, the normal being the c-axis.

4. The plate wave element of claim 1, wherein the piezoelectric body is formed of a piezoelectric thin film in which a normal of the upper surface of the piezoelectric body is oriented as a c-axis.

5. An electronic device comprising:
the plate wave element of claim 1; and
a signal line connected to the plate wave element.

6. A plate wave element comprising:
a piezoelectric body;
a comb-shaped electrode disposed on an upper surface of the piezoelectric body, the comb-shaped electrode exciting a Lamb wave as a main wave;
a first medium layer disposed on the upper surface of the piezoelectric body so as to cover the comb-shaped electrode; and
a second medium layer that is disposed on a lower surface of the piezoelectric body,
wherein the first medium layer is made of silicon oxide,
the piezoelectric body is made of lithium niobate, a thickness H1 of the piezoelectric body, a wavelength λ of the Lamb wave, and a thickness H2 of the first medium layer satisfy a condition that,
when a ratio H1/λ is not less than 0.075 less than 0.125, a ratio H2/λ is larger than 0 and smaller than 0.032,
when ratio H1/λ is not less than 0.125 less than 0.175, ratio H2/λ is larger than 0 and smaller than 0.046,
when ratio H1/λ is not less than 0.175 less than 0.225, ratio H2/λ is larger than 0 and smaller than 0.061,
when ratio H1/λ is not less than 0.225 less than 0.275, ratio H2/λ is larger than 0 and smaller than 0.084, and
when ratio H1/λ is not less than 0.275 less than 0.325, ratio H2/λ is larger than 0 and smaller than 0.110.

7. The plate wave element of claim 6, wherein the piezoelectric body is formed of a piezoelectric single-crystal substrate cut by a plane whose normal is a c-axis of the crystal structure.

8. The plate wave element of claim 7, wherein a crystal structure of the piezoelectric body is a rotation twin crystal about a normal of the upper surface of the piezoelectric body, the normal being the c-axis.

9. The plate wave element of claim 6, wherein the piezoelectric body is formed of a piezoelectric thin film in which a normal of the upper surface of the piezoelectric body is oriented as a c-axis.

10. An electronic device comprising:
the plate wave element of claim 6; and
a signal line connected to the plate wave element.

11. A plate wave element comprising:
a piezoelectric body;
a comb-shaped electrode disposed on an upper surface of the piezoelectric body, the comb-shaped electrode exciting a plate wave;
a first medium layer disposed on the upper surface of the piezoelectric body so as to cover the comb-shaped electrode, a transverse wave propagating through the first medium layer at a speed higher than a speed of a transverse wave at the plate wave;
a second medium layer disposed on a lower surface of the piezoelectric body, a transverse wave propagating through the second medium layer at a speed higher than a speed of a transverse wave at the plate wave;
a first sound absorbing layer disposed on an upper surface of the first medium; and
a second sound absorbing layer disposed on a lower surface of the second medium.

12. The plate wave element of claim 11, wherein a thickness of the first medium layer and a thickness of the second medium layer are greater than a wavelength of the plate wave.

13. The plate wave element of claim 11, wherein a thickness of the piezoelectric body and a thickness of the comb-shaped electrode are determined such that the speed of the plate wave is lower than a speed of a transverse wave propagating through the first medium layer and a speed of a transverse wave propagating through the second medium layer.

14. A plate wave element comprising:
a piezoelectric body;
a comb-shaped electrode disposed on an upper surface of the piezoelectric body, the comb-shaped electrode exciting a plate wave;
a first medium layer disposed on the upper surface of the piezoelectric body so as to cover the comb-shaped electrode, a transverse wave propagating through the first medium layer at a speed higher than a speed of a transverse wave at the plate wave; and
a second medium layer disposed on a lower surface of the piezoelectric body, a transverse wave propagating through the second medium layer at a speed higher than a speed of a transverse wave at the plate wave,
wherein the first medium layer and the second medium layer are made of medium identical to each other.

15. The plate wave element of claim 14, wherein a thickness of the first medium layer and a thickness of the second medium layer are greater than a wavelength of the plate wave.

16. The plate wave element of claim 14, wherein a thickness of the piezoelectric body and a thickness of the comb-shaped electrode are determined such that the speed of the plate wave is lower than a speed of a transverse wave propagating through the first medium layer and a speed of a transverse wave propagating through the second medium layer.

17. A plate wave element comprising:
a piezoelectric body;
a comb-shaped electrode disposed on an upper surface of the piezoelectric body, the comb-shaped electrode exciting a plate wave;
a first medium layer disposed on the upper surface of the piezoelectric body so as to cover the comb-shaped electrode, a transverse wave propagating through the first medium layer at a speed higher than a speed of a transverse wave at the plate wave; and
a second medium layer disposed on a lower surface of the piezoelectric body, a transverse wave propagating through the second medium layer at a speed higher than a speed of a transverse wave at the plate wave,
wherein a crystal structure of the piezoelectric body is a rotation twin crystal about a normal of the upper surface of the piezoelectric body, the normal being a c-axis of the crystal structure.

18. The plate wave element of claim 17, wherein a thickness of the first medium layer and a thickness of the second medium layer are greater than a wavelength of the plate wave.

19. The plate wave element of claim 17, wherein a thickness of the piezoelectric body and a thickness of the comb-shaped electrode are determined such that the speed of the plate wave is lower than a speed of a transverse wave propagating through the first medium layer and a speed of a transverse wave propagating through the second medium layer.

20. A plate wave element comprising:
a piezoelectric body;

a comb-shaped electrode disposed on an upper surface of the piezoelectric body, the comb-shaped electrode exciting a plate wave;

a first medium layer disposed on the upper surface of the piezoelectric body so as to cover the comb-shaped electrode;

a second medium layer disposed on a lower surface of the piezoelectric body;

a third medium layer disposed on an upper surface of the first medium layer, a transverse wave propagating through the third medium layer at a speed higher than a speed of a transverse wave at the plate wave; and a fourth medium layer disposed on a lower surface of the second medium layer, a transverse wave propagating through the fourth medium layer at a speed higher than a speed of a trans verse wave at the plate wave, wherein a transverse wave propagates through the first medium layer at a speed lower than a speed of a transverse wave propagating through the third medium layer, and a transverse wave propagates through the second medium layer at a speed lower than a speed of a transverse wave propagating through the fourth medium layer.

21. The plate wave element of claim 20, wherein the first medium layer and the second medium layer are made of silicon oxide.

22. The plate wave element of claim 20, wherein the comb-shaped electrode excites a Lamb wave as a main wave.

23. The plate wave element of claim 20, wherein a thickness of the third medium layer and a thickness of the fourth medium layer are substantially identical to each other.

24. The plate wave element of claim 20, wherein the third medium layer and the fourth medium layer are made of medium identical to each other.

25. The plate wave element of claim 20, wherein a crystal structure of the piezoelectric body is a rotation twin crystal about a normal of the upper surface of the piezoelectric body, the normal being a c-axis of the crystal structure.

26. An electronic device comprising:

the plate wave element of claim 20; and a signal line connected to the plate wave element.

* * * * *